(12) United States Patent
Banerjee et al.

(10) Patent No.: US 7,683,486 B2
(45) Date of Patent: Mar. 23, 2010

(54) ELECTRONIC APPARATUS INTERCONNECT ROUTING AND INTERCONNECT ROUTING METHOD FOR MINIMIZING PARASITIC RESISTANCE

(75) Inventors: Suman K. Banerjee, Chandler, AZ (US); Alain C. Duvallet, Austin, TX (US); Craig Jasper, Queen Creek, AZ (US); Olin L. Hartin, Chandler, AZ (US); Walter Parmon, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 249 days.

(21) Appl. No.: 11/302,007

(22) Filed: Dec. 9, 2005

(65) Prior Publication Data
US 2007/0132062 A1 Jun. 14, 2007

(51) Int. Cl.
*H01L 29/40* (2006.01)
(52) U.S. Cl. .................. 257/758; 257/759; 257/760
(58) Field of Classification Search .......... 257/758–760
See application file for complete search history.

(56) References Cited
U.S. PATENT DOCUMENTS
7,170,115 B2 * 1/2007 Tokunaga et al. ........... 257/204

| 2004/0196110 | A1 | 10/2004 | Boccuzzi et al. |
| 2004/0198013 | A1 | 10/2004 | Johansson |
| 2004/0201045 | A1 | 10/2004 | Kurosawa et al. |
| 2004/0203213 | A1 | 10/2004 | Chung |
| 2004/0214383 | A1 | 10/2004 | Altman |
| 2006/0091480 | A1* | 5/2006 | Desko et al. ............... 257/401 |
| 2007/0034960 | A1* | 2/2007 | Zhang et al. ............... 257/360 |

OTHER PUBLICATIONS

Peter Van Zant, Microchip Fabrication, 2000, McGraw-Hill, 4th edition, pp. 386 and 387.*

* cited by examiner

*Primary Examiner*—Thanh V Pham
(74) *Attorney, Agent, or Firm*—Ingrassia, Fisher & Lorenz, P.C.

(57) ABSTRACT

Method and apparatus are provided for routing interconnects of a dual-gate electronic device operating in a differential configuration. An electronic apparatus formed on a substrate is provided comprising a first interconnect (40, 42, 44) configured to couple to a first region of the substrate, a first gate (22, 24, 26, 28) coupled to the first interconnect and configured to receive a first differential input, a second interconnect (30, 32, 34, 36, 38) parallel to the first interconnect and configured to couple to a second region of the substrate, and a second gate (20) coupled to the second interconnect and configured to receive a second differential input. The first gate is parallel to the first interconnect, and the second gate is parallel to the second interconnect.

16 Claims, 3 Drawing Sheets

ELECTRONIC APPARATUS INTERCONNECT ROUTING AND INTERCONNECT ROUTING METHOD FOR MINIMIZING PARASITIC RESISTANCE

FIELD OF THE INVENTION

The present invention generally relates to interconnect routing in electronic devices, and more particularly relates to interconnect structures and interconnect routing methods for electronic devices operating in a differential configuration.

BACKGROUND OF THE INVENTION

Many electronic devices formed on a substrate are dual-gate or dual-port devices. One example of a dual-gate or dual-port electronic device is a Voltage-Variable Capacitor (VVC) cell. VVC cells are commonly used in Voltage-Controlled Oscillators (VCOs) to generate an oscillation frequency for establishing communications, such as in cellular communications. The efficiency of these VCOs may be determined by a quality, or "Q", factor and a tuning range. The Q factor is a measure of the amount of energy being stored and dissipated by the VCO, and the tuning range establishes a bandwidth of operation for the VCO based on the oscillation frequency. A higher Q factor and greater tuning range indicate a greater efficiency of the VCO.

A significant portion of the energy dissipated by a VCO may be attributed to energy dissipated across resistances in the VCO. One source of parasitic resistance contributing to energy dissipation may be found in the VVC cells. VVC cells include polysilicon gates or fingers that are typically formed on a substrate (e.g., in an Integrated Circuit (IC)) having channel regions formed therein, where the polysilicon gates are coupled together by metal interconnects. The metal interconnects, the polysilicon gates, the channel regions, and the substrate may each have a corresponding parasitic resistance that contributes to energy dissipation in the VCO.

One VVC cell configuration is a dual-gate VVC cell that is operated differentially to minimize the parasitic resistance contributed by the substrate. The dual-gate VVC cell includes interdigitated sets of polysilicon fingers (e.g., a first set of polysilicon fingers interdigitated with a second set of polysilicon fingers), and each set of polysilicon fingers is coupled together by a different metal interconnect. In conventional VVC cell arrays, one set of polysilicon fingers for each of the VVC cells are connected together by a first set of metal interconnects, and the other set of polysilicon fingers for each of the VVC cells are connected together by a second set of metal interconnects. The metal interconnects in the VVC have a significant parasitic resistance similar in magnitude to the parasitic resistances associated with the polysilicon fingers and substrate.

Accordingly, an interconnect configuration for a dual-gate or dual-port electronic device that minimizes parasitic resistance is desired. More specifically, an interconnect configuration for a VVC cell array that minimizes parasitic resistance is desired. In addition, a method for routing interconnects in a dual-gate or dual-port electronic device that minimizes parasitic resistance is desired. Furthermore, other desirable features and characteristics will become apparent from the subsequent detailed description of the invention and the appended claims, taken in conjunction with the accompanying drawings and this background of the invention.

BRIEF DESCRIPTION OF THE DRAWINGS

Exemplary embodiments of the present invention will hereinafter be described in conjunction with the following figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

Figure 1:
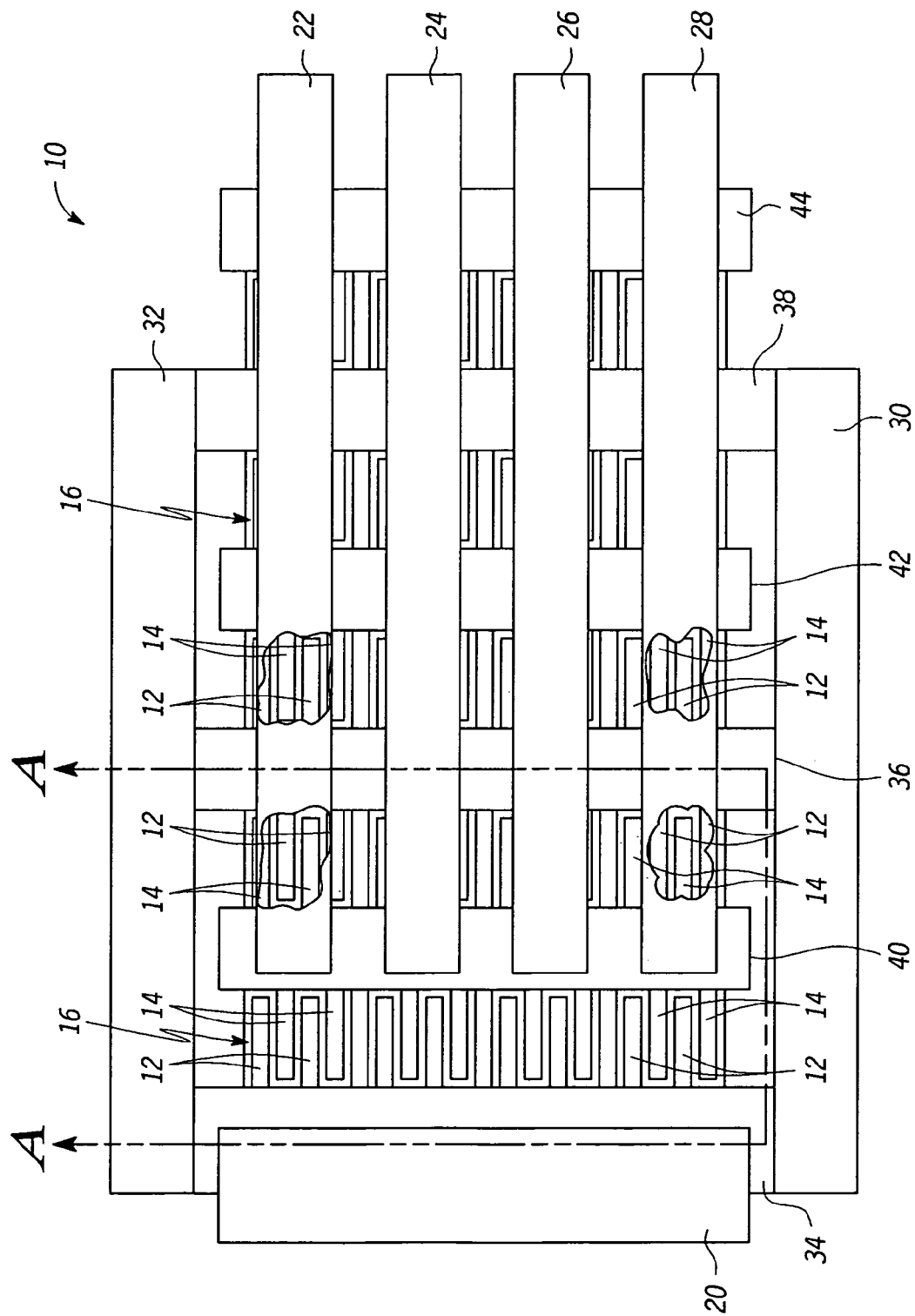
FIG. 1 is a top view of an exemplary embodiment of a Voltage Variable Capacitor (VVC) cell array in accordance with the present invention.

Referring to the drawings, FIG. 1 is top view of an exemplary embodiment of a Voltage Variable Capacitor (VVC) cell array 10 in accordance with the present invention. VVC cell array 10 comprises a plurality of VVC cells 16 that each have first and second sets of polysilicon gates or fingers 14, 12, a first set of metal interconnects 40, 42, 44 coupled to the first set of polysilicon fingers 14, a second set of metal interconnects 34, 36, 38 coupled to the second set of polysilicon fingers 12, and a third set of metal interconnects 22, 24, 26, 28 coupled to each metal interconnect of the first set of metal interconnects 40, 42, 44. VVC cell array 10 additionally comprises first and second metal interconnects 30, 32, each respectively coupled to one of the opposing ends of the metal interconnects of the second set of metal interconnects 34, 36, 38, and a third metal interconnect 20 coupled to an end interconnect 34 of the second set of metal interconnects 34, 36, 38.

In this exemplary embodiment, each of metal interconnects 22, 24, 26, 28, 30, 32, 34, 36, 38, 40, 42, 44 are substantially parallel to one another to minimize any parasitic resistance in VVC cell array 10 that may be attributable to the metal interconnects. The first set of metal interconnects 40, 42, 44 are parallel because each of metal interconnects 40, 42, and 44 are parallel to one another and to a single axis (e.g., the lengthwise axis of any of metal interconnects 40, 42, and 44). Similarly, the second set of metal interconnects 34, 36, 38 are parallel because each of metal interconnects 34, 36, and 38 is parallel to one another and to a single axis (e.g., the lengthwise axis of any of metal interconnects 34, 36, and 38), and the third set of metal interconnects 22, 24, 26, 28 are parallel because each of metal interconnects 22, 24, 26, and 28 is parallel to one another and to a single axis (e.g., the lengthwise axis of any of metal interconnects 22, 24, 26, and 28). Additionally, the third set of metal interconnects 22, 24, 26, 28 is both perpendicular and parallel to the second set of metal interconnects 34, 36, 38 because the axis of the third set of metal interconnects 22, 24, 26, 28 is both perpendicular and parallel to the axis of the second set of metal interconnects 34, 36, 38. For example, the third set of metal interconnects 22, 24, 26, 28 may be positioned in a plane that is different from but parallel to the plane in which the second set of metal interconnects 34, 36, 38 is positioned such that the axes of the third and second sets of metal interconnects are oriented perpendicular to one another. Although the third set of metal interconnects 22, 24, 26, 28 is described as both perpendicular and parallel to the second set of metal interconnects 34, 36, 38, the third and second sets of metal interconnects may be oriented differently from a perpendicular relationship with respect to one another while maintaining the parallel plane relationship. For example, the third and second sets of the metal interconnects may be positioned in different parallel planes while the axes of the third and second sets of the metal interconnects are oriented at an angle between parallel and perpendicular.

From these relationships between the sets of metal interconnects, VVC cell array 10 has a metal interconnect structure that minimizes any energy dissipation due to such parasitic resistance, and thus, when incorporated into a Voltage Controlled Oscillator (VCO), VVC cell array 10 contributes to a higher Q factor of the VCO. Although the interconnect routing of the present invention is shown and described in VVC cell array 10, this interconnect routing may be applied to a number of other different dual-gate or dual-port electronic devices formed on a substrate and configured to receive differential input signals. Additionally, the interconnect routing of the present invention may be applied to devices where reduction of resistance is desired and is well suited for test configurations (e.g., for model extraction of data) to measure smaller signals that may not be readily measured due to noise.

VVC cells 16 may take a variety of configurations. For example, VVC cell 16 may include, but is not necessarily limited to, a P-type substrate (e.g., formed of P-type silicon) and an N-type well disposed in a portion of the upper surface of the P-type substrate. Polysilicon finger or gate 12 is disposed over a gate insulator and N-type well that is different from polysilicon finger or gate 14. VVC cells 16 may also take other conventional configurations such as P-type and N-type varactors using simple NMOS and PMOS transistors, a combination of P- and N-type accumulation-depletion mode varactors, or the like. VVC cells can be N-type VVC (NVVC) structures with an N-type well and with either N-doped or P-doped polysilicon gates. VVC cells may also be P-type VVC (PVVC) structures with a P-type well and with either N-doped or P-doped polysilicon gates. The gate material can be polysilicon or include a metal or combinations thereof depending on the selected technology. The gate dielectric can be silicon dioxide, any other dielectric material, or combinations thereof. Additionally, for other types of dual-gate electronic devices, a variety of substrates may be used including, by way of example and not of limitation, silicon, Silicon-On-Insulator (SOI), III-V materials, or the like.

To provide an input current to operate VVC cells 16, first and second metal interconnects 30, 32 are coupled to opposite ends, respectively, of the second set of metal interconnects 34, 36, 38, which are coupled to the second set of polysilicon fingers 12, and the third set of metal interconnects 22, 24, 26, 28 are coupled to the first set of metal interconnects 40, 42, 44, which are coupled to the first set of polysilicon fingers 14. Third metal interconnect 20 provides an input to the second set of polysilicon fingers 12, and the third set of metal interconnects 22, 24, 26, 28 provide an input to the first set of polysilicon fingers 14. Each of the metal interconnects 20, 22, 24, 26, 28, 30, 32, 34, 36, 38, 40, 42, 44 is a metal layer formed using conventional IC manufacturing techniques. In this exemplary embodiment, the third set of metal interconnects 22, 24, 26, 28 is a top-most metal layer of VVC cell array 10, and polysilicon fingers 12 and 14 are located at a lower level or at a substrate level of VVC cell array 10 as shown by cut-outs of metal interconnects 22 and 28. Additional metal layers may be coupled between polysilicon fingers 12 and 14 the metal interconnects using vias. In this configuration, a differential input may be supplied to the second set of polysilicon fingers 12 via two opposing directions (e.g., converging from the direction of metal interconnect 32 and converging from the direction of metal interconnect 30). Additionally, a differential input may be supplied to the first set of polysilicon fingers 14 via two opposing directions (e.g., diverging from metal interconnect 40 to polysilicon fingers on one side of metal interconnect 40 and diverging from metal interconnect 40 to polysilicon fingers on the other side of metal interconnect 40).

In addition to having some parallel metal interconnects in VVC cell array 10, the first set of metal interconnects 40, 42, 44 are interleaved with respect to the third set of metal interconnects 22, 24, 26, 28. Although VVC cell array 10 is shown as an array of four VVC cells by five VVC cells, VVC cell array 10 may have a variety of cell array dimensions. The number of metal interconnects in each of the first, second and third set of metal interconnects preferably varies with respect to the number of VVC cells 16. For example, the number of metal interconnects in the first set of metal interconnects 40, 42, 44 varies with respect to the first set of polysilicon fingers 14 in a width dimension of VVC cell array 10, the number of metal interconnects in the second set of metal interconnects 34, 36, 38 varies with respect to the second set of polysilicon fingers 12 in the width dimension of VVC cell array 10, and the number of metal interconnects of the third set of metal interconnects 22, 24, 26, 28 varies with respect to the first set of polysilicon fingers 14 in a length dimension of VVC cell array 10. Additionally, although each VVC cell 16 is shown as a first pair of polysilicon fingers interdigitated with a second pair of polysilicon fingers, the number of polysilicon fingers for VVC cells 16 may be varied.

Figure 2:
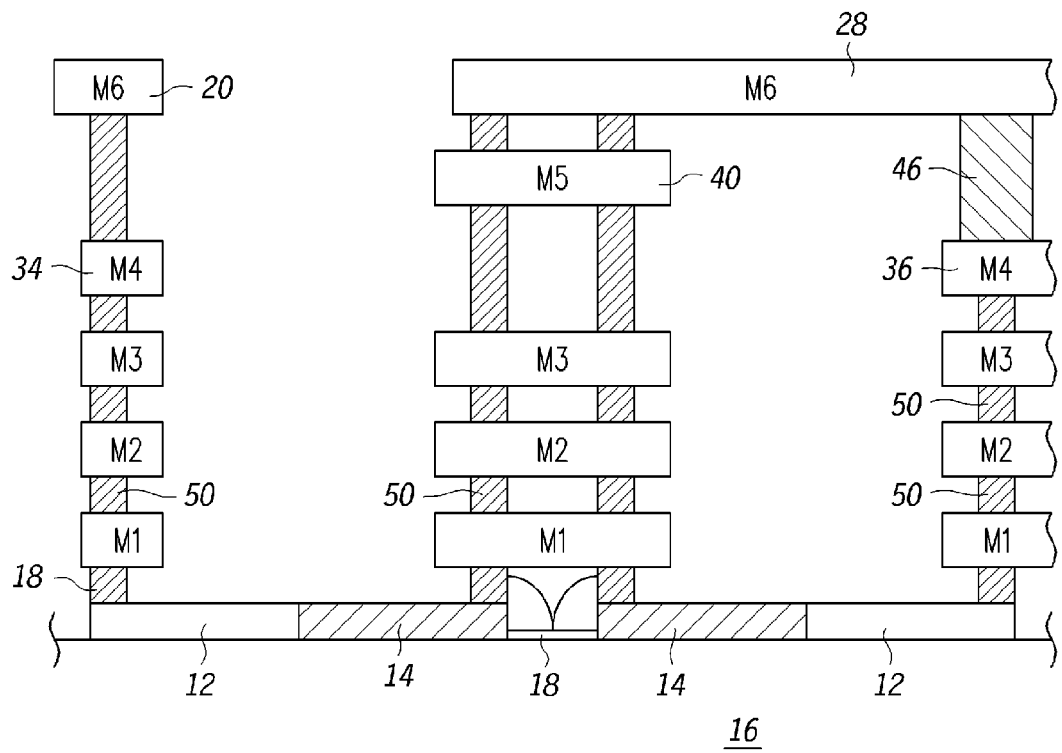
FIG. 2 is a cross-sectional view of the VVC cell array shown in FIG. 1 taken along line A-A in accordance with an exemplary embodiment.

FIG. 2 is a cross-sectional view a VVC cell 16 of VVC cell array 10 shown in FIG. 1 taken along line A-A in accordance with an exemplary embodiment. As previously mentioned, each of metal interconnects 20, 22, 24, 26, 28, 30, 32, 34, 36, 38, 40, 42, 44 is a metal layer formed using conventional IC manufacturing techniques. VVC cell array 10 may have a variety of different metal layers. For example, VVC cell array 10 comprises a first metal layer (M1), a second metal layer (M2), a third metal layer (M3), a fourth metal layer (M4), a fifth metal layer (M5), and a sixth metal layer (M6). To couple the first and second sets of polysilicon fingers 12, 14 to the proper input interconnects, one or more metal layers (e.g., M1, M2, M3, M4, M5, and M6) may be coupled together using conventional vias 50. The first of these metal layers (e.g., M1) is coupled to polysilicon fingers 12, 14 using conventional contact vias 18. By routing each set of polysilicon fingers 12, 14 in alternate metal layers, parasitic capacitance coupling is minimized in each VVC cell 16.

In this exemplary embodiment, the thickness of the metal layers may vary depending on the particular metal interconnect. In general, the topmost metal layer (e.g., M6) of VVC cell array 10 may be typically thicker than lower metal layers and has a lower resistance than the thinner, lower metal layers (e.g., M1, M2, M3, M4, and M5), and thus the input interconnects preferably comprise the top metal layer (e.g., M6). For example, each of the third set of metal interconnects 22, 24, 26, 28, and third metal interconnect 20 each comprise the top metal layer (e.g., M6).

In this exemplary embodiment, each of the first set of metal interconnects 40, 42, 44 comprises a fifth metal layer (M5) or penultimate metal layer of VVC cell array 10, and the first set of polysilicon fingers 14 are coupled to the fifth metal layers (M5) of the first set of metal interconnects via metal layers M1, M2, M3, and M4 and has contacts 18 and vias 50. The fifth metal layers (M5) associated with each of the first set of metal interconnects are coupled with vias 50 to the top metal layers or sixth metal layers (M6) of the third set of metal interconnects 22, 24, 26, 28. Each of the second set of metal interconnects 34, 36, 38 comprises a fourth metal layer (M4) of VVC cell array 10, and the second set of polysilicon fingers 12 are coupled to the fourth metal layers (M4) of the second set of metal interconnects 34, 36, 38 via metal layers M1, M2, and M3 and has contacts 18 and vias 50. Second and third metal interconnects 30, 32 each comprise a fourth metal layer (M4) that are coupled (e.g., to the ends of the interconnects) to the fourth metal layers of the second set of metal interconnects 34, 36, 38, as best shown in FIG. 1. Metal interconnect 20 is a sixth metal layer (M6) connected to the second set of metal interconnects 34, 36, 38.

To isolate the first set of polysilicon gates 14 from the second set of polysilicon gates 12 and further reduce any parasitic capacitance coupling associated with VVC cell array 10, a dielectric or an air bridge 46 may be introduced between the overlapping regions of the top metal layers or the sixth metal layers (M6) of the third set of metal interconnects 22, 24, 26, 28 and the fourth metal layers (M4) of the second set of metal interconnects 36, 38, with the exception of end interconnect 34, as best shown in FIG. 2. Dielectric or air bridge 46 is introduced to reduce capacitive coupling between the metal layers and thereby reduces the capacitive coupling between the two sets of gates. To couple the input interconnect (e.g., third metal interconnect 20) to the second set of polysilicon gates 12, the fourth metal layer (M4 of end interconnect 34 is coupled via a fifth metal layer (M5) and vias 50 to the sixth metal layer (M6) of third metal interconnect 20.

Figure 3:
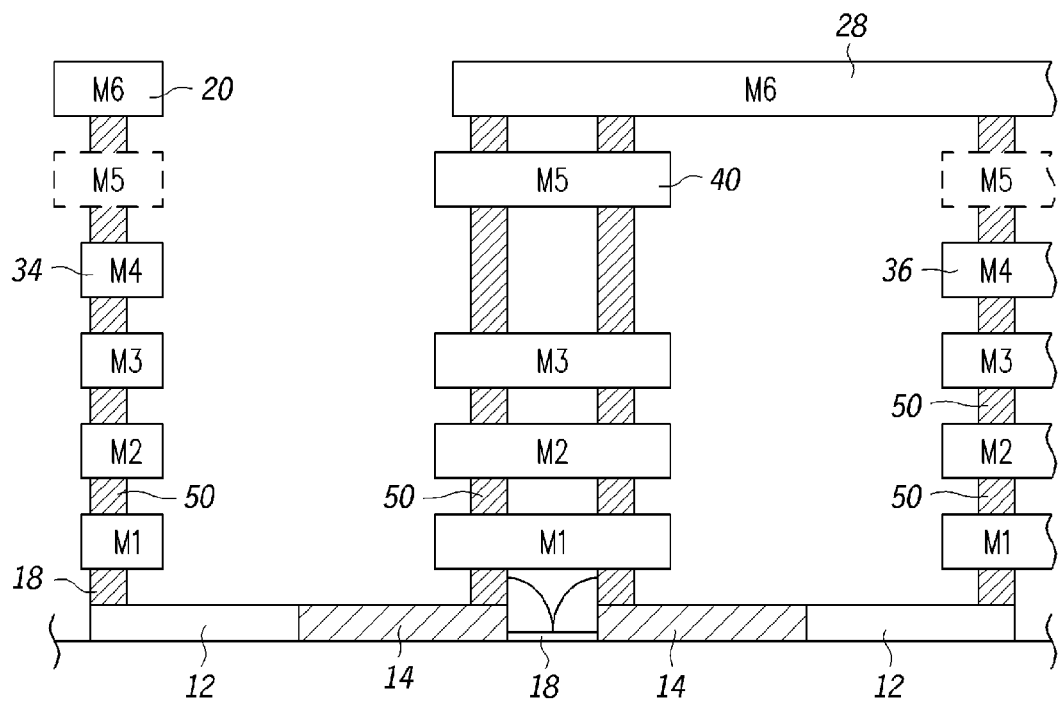
FIG. 3 is a cross-sectional view of the VVC cell array shown in FIG. 1 taken along line A-A in accordance with another exemplary embodiment.

FIG. 3 is a cross-sectional view of VVC cell array 10 shown in FIG. 1 taken along line A-A in accordance with another exemplary embodiment. In this exemplary embodiment, additional fifth metal layers (M5), illustrated by dashed lines, are coupled to the fourth metal layers (M4) of the third set of metal interconnects 22, 24, 26, 28 by vias, and the sixth metal layers (M6) of the third set of metal interconnects 22, 24, 26, 28 are coupled to the fifth metal layers (M5) by vias. The number of metal layers between the third set of metal interconnects 22, 24, 26, 28 and the top metal layer of the second set of metal interconnects 36, 38 may be varied while reducing capacitive coupling between the third set of metal interconnects 22, 24, 26, 28 and the second set of metal interconnects 36, 38.

Figure 4:
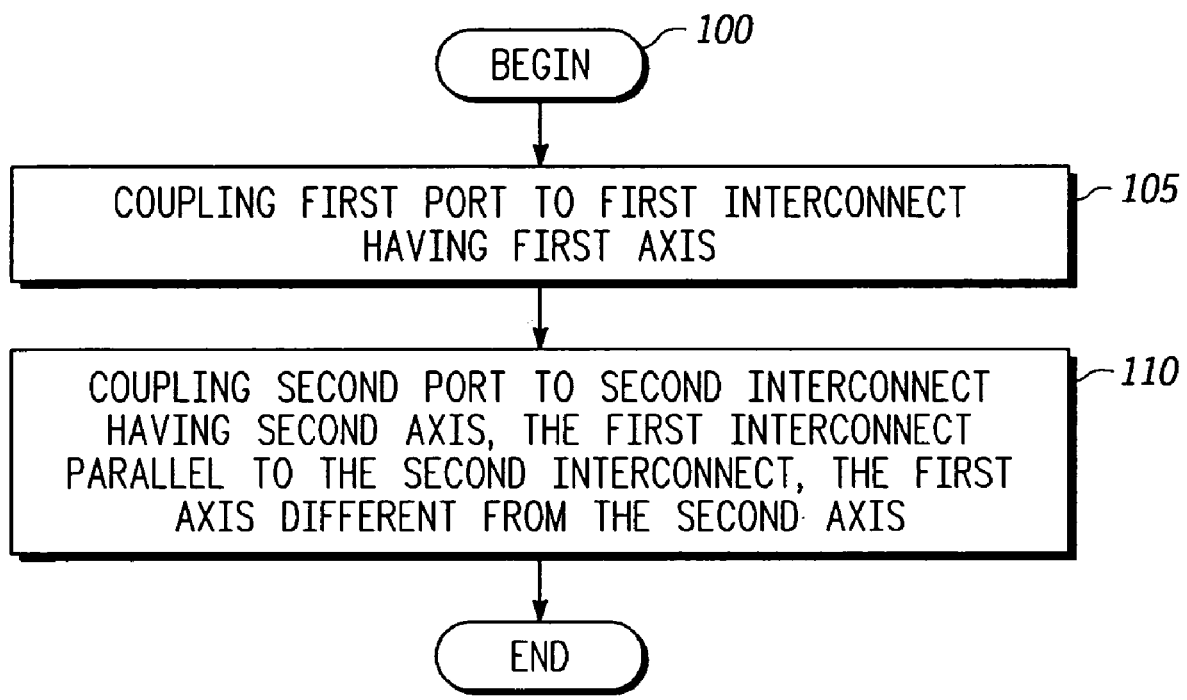
FIG. 4 is a flow diagram of a method of routing interconnects in a dual-gate electronic device in accordance with an exemplary embodiment of the present invention.

FIG. 4 is a flow diagram of a method for routing interconnects in a VVC cell array in accordance with an exemplary embodiment of the present invention. The method begins at step 100. Referring to FIGS. 1-4, the VVC cell array 10 is a dual-port device, and each of the first and second sets of polysilicon fingers 14 and 12 is a port of the VVC cell array 10. The first set of polysilicon fingers 14 (capacitive electrodes) is coupled to the first set of metal interconnects 40, 42, 44, which are parallel interconnects because each of interconnects 40, 42, and 44 is parallel to one another and to a single first axis (e.g., the lengthwise axis of any of interconnects 40, 42, and 44), at step 105. The second set of polysilicon fingers 12 is coupled to the second set of metal interconnects 34, 36, 38, which are parallel interconnects because each of interconnects 34, 36, and 38 is parallel to one another and to a single second axis (e.g., the lengthwise axis of any of interconnects 34, 36, and 38), and to metal interconnect 20 at step 110. The first set of polysilicon fingers 14 is interdigitated with the second set of polysilicon fingers 12. The first set of metal interconnects 40, 42, 44 are parallel to the second set of metal interconnects 34, 36, 38. The first set of metal interconnects 40, 42, 44 is coupled to the third set of metal interconnects 22, 24, 26, 28 at step 115. Each of the first set of polysilicon fingers 14 is coupled together via the third set of metal interconnects 22, 24, 26, 28. In an exemplary embodiment, the third set of metal interconnects 22, 24, 26, 28 is oriented perpendicular to the second set of metal interconnects 34, 36, 38 such that the axis of the third set of metal interconnects 22, 24, 26, 28 is different from the axis of the second set of metal interconnects 22, 24, 26, 28. As best shown in FIG. 1, the third set of metal interconnects 22, 24, 26, 28 is perpendicular to the second set of metal interconnects 22, 24, 26, 28. In another exemplary embodiment, each metal interconnect of the first set of metal interconnects 40, 42, 44 comprises a penultimate metal layer (e.g., metal layer M5) of VVC cell array 10 and each metal interconnect of the third set of metal interconnects 22, 24, 26, 28 comprises a top metal layer (e.g., metal layer M6) of VVC cell array 10 that is coupled to the penultimate metal layer of the metal interconnects of the first set of metal interconnects 40, 42, 44.

A dielectric or an air bridge 46 may. optionally be coupled between the third set of metal interconnects 22, 24, 26, 28 and the second set of metal interconnects 34, 36, 38 at the overlapping regions of the same. In an exemplary embodiment, each metal interconnect of the second set of metal interconnects 34, 36, 38 comprises a lower metal layer (e.g., metal layer M4 or lower than the penultimate metal layer M5) of VVC cell array 10, each metal interconnect of the third set of metal interconnects 22, 24, 26, 28 comprises a top metal layer (e.g., metal layer M6) of VVC cell array 10, and a dielectric or an air bridge 46 is coupled between the top metal layer and the lower metal layer at the overlapping regions of the third set of metal interconnects 22, 24, 26, 28 and the second set of metal interconnects 34, 36, 38.

An input interconnect 20 may optionally be coupled to the first interconnect 34 of the second set of metal interconnects 34, 36, 38. Interconnect 30 may optionally be coupled to a first set of ends of the second set of metal interconnects 34, 36, 38, and interconnect 32 may optionally be coupled to a second set of ends of the second set of metal interconnects 34, 36, 38, the first set of ends opposing the second set of ends, respectively.

The interconnect routing of VVC cell array 10 (FIG. 1) minimizes the parasitic resistance associated with the metal interconnects by coupling the metal interconnects, in accordance with the present invention, such that any metal interconnect parasitic resistance is preferably accumulated in parallel. This interconnect routing may be applied to other multi-port devices (e.g., having at least two ports) to realize the benefits of the minimized parasitic resistance of the metal interconnects. When designing a VVC, improvements to increase the Q factor of the VVC are generally balanced against improvements to increase the tuning range of the VVC. The Q factor of the VVC is improved by minimizing the parasitic resistance of the metal interconnects. The tuning range of the VVC is improved by minimizing the parasitic capacitance of the metal interconnects through the routing of alternate metal layers and the use of the dielectric layer or air bridge. Additionally, VVC cell array 10 routes each set of polysilicon fingers 12, 14 with alternate metal layers to minimize parasitic capacitance coupling.

In an exemplary embodiment, an electronic apparatus formed on a substrate comprises a first gate coupled to the substrate and configured to receive a first differential input signal, a first interconnect coupled to the first gate and having a first axis, a second gate coupled to the substrate and configured to receive a second differential input signal, and a second interconnect coupled to the second gate and having a second axis. The second interconnect is parallel to the first interconnect, and the first axis is different from the second axis. The electronic apparatus may further comprise a first plurality of stacked interconnects coupled to the first gate, a second plurality of stacked interconnects coupled to the second gate, and an air bridge between the first interconnect and the second interconnect. The first interconnect is a top-most stacked interconnect of the first plurality of stacked interconnects, and the second interconnect is a top-most stacked interconnect of the second plurality of stacked interconnects. The electronic apparatus may further comprise a first plurality of stacked interconnects coupled to the first gate, a second plurality of stacked interconnects coupled to the second gate, and a dielectric between said first interconnect and said second interconnect. The first interconnect is a top-most stacked interconnect of the first plurality of stacked interconnects, and the second interconnect is a top-most stacked interconnect of the second plurality of stacked interconnects. The electronic apparatus may further comprise a plurality of layers and a dielectric between the first interconnect and the second interconnect. The first interconnect is located on a penultimate layer of the plurality of layers, and the second interconnect is located on a top-most layer of the plurality of layers. The electronic apparatus may further comprise a plurality of layers and an air bridge between the first interconnect and the second interconnect. The first interconnect is located on a penultimate layer of the plurality of layers, and the second interconnect is located on a top-most layer of the plurality of layers. The first interconnect is configured to feed the first differential input to the first gate from two opposing directions. The second interconnect is configured to feed the second differential input to the second gate from two opposing directions. The substrate is selected from the group consisting of silicon, silicon-on-insulator, and a III-IV metal.

In another exemplary embodiment, a capacitor array comprises a first set of capacitive gates, a first set of interconnects coupled to the first set of capacitive gates, a second set of capacitive gates interdigitated with the first set of capacitive gates, and a second set of interconnects coupled to the second set of capacitive gates. The first set of interconnects is aligned along a first axis of the capacitor array, and the second set of interconnects is parallel to the first set of interconnects and aligned along a second axis of the capacitor array. The second axis different from the first axis. The capacitor array may further comprise a dielectric between a top-most interconnect of the first set of interconnects and a top-most interconnect of the second set of interconnects. The capacitor array may further comprise an air bridge between a top-most interconnect of the first set of interconnects and a top-most interconnect of the second set of interconnects. The first set of interconnects is configured to supply the first set of capacitive gates with a differential input in two opposing directions. The second set of interconnects is configured to supply the second set of capacitive gates with a differential input in two opposing directions. Each of the first set of interconnects has a thickness, and a top-most interconnect of the first set of interconnects has a thickness greater than the thickness of a lower interconnect of the first set of interconnects. Each of the second set of interconnects has a thickness, and a top-most interconnect of the second set of interconnects has a thickness greater than the thickness of a lower interconnect of the first set of interconnects.

In another exemplary embodiment, a method of routing interconnects in a multi-port electronic apparatus comprises the steps of coupling a first port of the multi-port electronic apparatus to a first interconnect, and coupling a second port of the multi-port electronic apparatus to a second interconnect. The first interconnect has a first axis, the second interconnect has a second axis, the first interconnect is parallel to the second interconnect, and the first axis is different from the second axis. The first axis is perpendicular to the second axis. The step of coupling the first port comprises coupling the first port in parallel with the first interconnect, and the step of coupling the second port comprises coupling the second port in parallel with the second interconnect. The first interconnect comprises a top layer, and the second interconnect comprises a lower layer. The method may further comprise forming a dielectric between the top layer and the lower layer. The method may further comprise the steps of directing a first differential input to the first port in two opposing directions along the first interconnect, and directing a second differential input to the second port in two opposing directions along the second interconnect.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electronic apparatus formed on a substrate, the electronic apparatus comprising:
    a first set of polysilicon fingers coupled to the substrate and configured to receive a first differential input signal;
    a first interconnect formed of a first metal layer and coupled to said first set of polysilicon fingers and having a first lengthwise axis;
    a second set of polysilicon fingers coupled to the substrate and interdigitated with the first set of polysilicon fingers, wherein the second set of polysilicon fingers is configured to receive a second differential input signal; and
    a second interconnect formed of a second metal layer that is a different layer from the first metal layer, the second interconnect being coupled to said second set of polysilicon fingers and having a second lengthwise axis, said second lengthwise axis parallel to said first lengthwise axis, and said first lengthwise axis different from said second lengthwise axis;
    a third interconnect coupled to said first interconnect and said first set of polysilicon fingers, said third interconnect having a third lengthwise axis that is perpendicular to said first lengthwise axis, wherein the third interconnect is formed of a different layer from the second metal layer;
    a fourth interconnect coupled to said second interconnect and said second set of polysilicon fingers, said fourth interconnect having a fourth lengthwise axis that is perpendicular to said second lengthwise axis; and
    an air bridge between said third interconnect and said second interconnect.

2. An electronic apparatus formed on a substrate, the electronic apparatus comprising:

a first set of polysilicon fingers coupled to the substrate and configured to receive a first differential input signal;

a first interconnect formed of a first metal layer and coupled to said first set of polysilicon fingers and having a first lengthwise axis;

a second set of polysilicon fingers coupled to the substrate and interdigitated with the first set of polysilicon fingers, wherein the second set of polysilicon fingers is configured to receive a second differential input signal; and a second interconnect formed of a second metal layer that is a different layer from the first metal layer, the second interconnect being coupled to said second set of polysilicon fingers and having a second lengthwise axis, said second lengthwise axis parallel to said first lengthwise axis, and said first lengthwise axis different from said second lengthwise axis;

a third interconnect coupled to said first interconnect and said first set of polysilicon fingers, said third interconnect having a third lengthwise axis that is perpendicular to said first lengthwise axis;

a fourth interconnect coupled to said second interconnect and said second set of polysilicon fingers, said fourth interconnect having a fourth lengthwise axis that is perpendicular to said second lengthwise axis, said second interconnect located on a penultimate layer of said plurality of layers, and said third interconnect located on a top-most layer of said plurality of layers; and an air bridge between said third interconnect and said second interconnect.

3. An electronic apparatus formed on a substrate, the electronic apparatus comprising:

a first set of polysilicon fingers coupled to the substrate and configured to receive a first differential input signal;

a first interconnect formed of a first metal layer and coupled to said first set of polysilicon fingers and having a first lengthwise axis;

a second set of polysilicon fingers coupled to the substrate and interdigitated with the first set of polysilicon fingers, wherein the second set of polysilicon fingers is configured to receive a second differential input signal; and a second interconnect formed of a second metal layer that is a different layer from the first metal layer, the second interconnect being coupled to said second set of polysilicon fingers and having a second lengthwise axis, said second lengthwise axis parallel to said first lengthwise axis, and said first lengthwise axis different from said second lengthwise axis;

a third interconnect coupled to said first interconnect and said first set of polysilicon fingers, said third interconnect having a third lengthwise axis that is perpendicular to said first lengthwise axis, wherein the first interconnect and the third interconnect form portions of a first plurality of stacked interconnects that is coupled to said first set of polysilicon fingers, and said third interconnect a top-most stacked interconnect of said first plurality of stacked interconnects; and a fourth interconnect coupled to said second interconnect and said second set of polysilicon fingers, said fourth interconnect having a fourth lengthwise axis that is perpendicular to said second lengthwise axis, wherein the second interconnect and the fourth interconnect form portions of a second plurality of stacked interconnects that is coupled to said second set of polysilicon fingers, and said second interconnect a top-most stacked interconnect of said second plurality of stacked interconnects.

4. An electronic apparatus formed on a substrate, the electronic apparatus comprising:

a first set of polysilicon fingers coupled to the substrate and configured to receive a first differential input signal;

a first interconnect formed of a first metal layer and coupled to said first set of polysilicon fingers and having a first lengthwise axis;

a second set of polysilicon fingers coupled to the substrate and interdigitated with the first set of polysilicon fingers, wherein the second set of polysilicon fingers is configured to receive a second differential input signal;

a second interconnect formed of a second metal layer that is different from the first metal layer, the second interconnect being coupled to said second set of polysilicon fingers and having a second lengthwise axis, said second lengthwise axis parallel to said first lengthwise axis, and said first lengthwise axis different from said second lengthwise axis;

a third interconnect coupled to said first interconnect and said first set of polysilicon fingers, said third interconnect having a third lengthwise axis that is perpendicular to said first lengthwise axis, wherein the third interconnect is formed of a different layer from the second metal layer; and an air bridge between said third interconnect and said second interconnect.

5. An electronic apparatus according to claim 4, wherein the first, second, and third interconnects are formed of a plurality of layers, said second interconnect is located on a penultimate layer of said plurality of layers, and said third interconnect located on a top-most layer of said plurality of layers.

6. An electronic apparatus according to claim 4, wherein said first interconnect is configured to feed said first differential input to said first set of polysilicon fingers from two opposing directions.

7. An electronic apparatus according to claim 4, wherein said second interconnect is configured to feed said second differential input to said second set of polysilicon fingers from two opposing directions.

8. An electronic apparatus according to claim 4, wherein the substrate is selected from the group consisting of silicon, silicon-on-insulator, and a III-IV metal.

9. An electronic apparatus according to claim 4, further comprising:

a fourth interconnect coupled to said second interconnect and said second set of polysilicon fingers, said fourth interconnect having a fourth lengthwise axis that is perpendicular to said second lengthwise axis.

10. An electronic apparatus according to claim 9, wherein the first interconnect and the third interconnect form portions of a first plurality of stacked interconnects that is coupled to said first set of polysilicon fingers, and said third interconnect a top-most stacked interconnect of said first plurality of stacked interconnects, and wherein the second interconnect and the fourth interconnect form portions of a second plurality of stacked interconnects that is coupled to said second set of polysilicon fingers, and said second interconnect a top-most stacked interconnect of said second plurality of stacked interconnects.

11. An electronic apparatus formed on a substrate, the electronic apparatus comprising:

a first set of polysilicon fingers coupled to the substrate and configured to receive a first differential input signal;

a first interconnect formed of a first metal layer and coupled to said first set of polysilicon fingers and having a first lengthwise axis;

a second set of polysilicon fingers coupled to the substrate and interdigitated with the first set of polysilicon fingers, wherein the second set of polysilicon fingers is configured to receive a second differential input signal;

a second interconnect formed of a second metal layer and coupled to said second set of polysilicon fingers and having a second lengthwise axis, said second lengthwise axis parallel to said first lengthwise axis;

a third interconnect coupled to said first interconnect and said first set of polysilicon fingers, said third interconnect having a third lengthwise axis that is perpendicular to said first lengthwise axis, wherein the third interconnect is formed of a different layer from the second metal layer; and an air bridge between said third interconnect and said second interconnect.

12. An electronic apparatus according to claim 11, wherein the first, second, and third interconnects are formed of a plurality of layers, said second interconnect is located on a penultimate layer of said plurality of layers, and said third interconnect located on a top-most layer of said plurality of layers.

13. An electronic apparatus according to claim 11, further comprising:

a fourth interconnect coupled to said second interconnect and said second set of polysilicon fingers, said fourth interconnect having a fourth lengthwise axis that is perpendicular to said second lengthwise axis, wherein the first interconnect and the third interconnect form portions of a first plurality of stacked interconnects that is coupled to said first set of polysilicon fingers, and said third interconnect a top-most stacked interconnect of said first plurality of stacked interconnects, and wherein the second interconnect and the fourth interconnect form portions of a second plurality of stacked interconnects that is coupled to said second set of polysilicon fingers, and said second interconnect a top-most stacked interconnect of said second plurality of stacked interconnects.

14. An electronic apparatus according to claim 13, wherein said first interconnect and said third interconnect are configured to feed said first differential input to said first set of polysilicon fingers from two opposing directions.

15. An electronic apparatus according to claim 13, wherein said second interconnect and said fourth interconnect are configured to feed said second differential input to said second set of polysilicon fingers from two opposing directions.

16. An electronic apparatus according to claim 11, wherein the substrate is selected from the group consisting of silicon, silicon-on-insulator, and a III-IV metal.

* * * * *